United States Patent
Han

(10) Patent No.: US 11,396,627 B2
(45) Date of Patent: Jul. 26, 2022

(54) PEROVSKITE FILM AND METHOD FOR MANUFACTURING THE SAME, PEROVSKITE ELECTROLUMINESCENT DEVICE AND METHOD FOR MANUFACTURING THE SAME, AND DISPLAY DEVICE

(71) Applicant: BOE Technology Group Co., Ltd., Beijing (CN)

(72) Inventor: Dengbao Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/760,718

(22) PCT Filed: Dec. 5, 2018

(86) PCT No.: PCT/CN2018/119365
§ 371 (c)(1),
(2) Date: Apr. 30, 2020

(87) PCT Pub. No.: WO2019/200940
PCT Pub. Date: Oct. 24, 2019

(65) Prior Publication Data
US 2020/0255727 A1 Aug. 13, 2020

(30) Foreign Application Priority Data
Apr. 20, 2018 (CN) .......................... 201810360461.8

(51) Int. Cl.
*C09K 11/66* (2006.01)
*H01L 51/50* (2006.01)
*H01L 51/56* (2006.01)
*B82Y 20/00* (2011.01)
*B82Y 30/00* (2011.01)

(52) U.S. Cl.
CPC .......... *C09K 11/664* (2013.01); *H01L 51/502* (2013.01); *H01L 51/56* (2013.01); *B82Y 20/00* (2013.01); *B82Y 30/00* (2013.01)

(58) Field of Classification Search
CPC ..... C09K 11/664; H01L 51/502; H01L 51/56; B92Y 20/00; B92Y 30/00; B82Y 20/00; B82Y 30/00
See application file for complete search history.

(56) References Cited

U.S. PATENT DOCUMENTS

| 9,431,613 | B2* | 8/2016 | Lin | H01L 51/4273 |
| 9,983,319 | B2* | 5/2018 | Fischer | G21K 4/00 |
| 10,047,284 | B2* | 8/2018 | Lee | C09K 11/025 |
| 2017/0084648 | A1* | 3/2017 | Liu | H01L 27/14603 |
| 2017/0369772 | A1* | 12/2017 | Lee | C09K 11/025 |
| 2018/0323014 | A1* | 11/2018 | Wang | H01L 51/4246 |

FOREIGN PATENT DOCUMENTS

| CN | 103956394 A | 7/2014 |
| CN | 106967417 A | 7/2017 |
| WO | 2017184292 A1 | 10/2017 |

OTHER PUBLICATIONS

Office Action dated Mar. 30, 2020 issued in corresponding Chinese Application No. 201810360461.8.
Extended European Search Report dated Nov. 22, 2021 corresponding to application No. 18910236.1-1105.
Han, Dengbao, et al. "Efficient Light-Emitting Diodes Based on in Situ Fabricated FAPbBr3 Nanocrystals: The Enhancing Role of the Ligand-Assisted Reciprocation Process"; ACS Nano; 2018; 12, 8808-8816.

* cited by examiner

*Primary Examiner* — C Melissa Koslow
(74) *Attorney, Agent, or Firm* — Nath, Goldberg & Meyer; Joshua B. Goldberg

(57) ABSTRACT

Provided are a perovskite film and method for manufacturing the same, a perovskite electroluminescent device and method for manufacturing the same, and a display device, which belongs to the technical field of displaying. The perovskite film comprises a crystalline perovskite and a halogenated amine ligand grafted onto the crystalline perovskite. Since the perovskite film comprises the halogenated amine ligand, the surface of the perovskite film is smooth, and the surface coverage of the crystalline perovskite is high without significant void defects. Meanwhile, the perovskite film also has a high fluorescence quantum yield due to the halogenated amine ligand comprised in the perovskite film.

14 Claims, 14 Drawing Sheets

PEROVSKITE FILM AND METHOD FOR MANUFACTURING THE SAME, PEROVSKITE ELECTROLUMINESCENT DEVICE AND METHOD FOR MANUFACTURING THE SAME, AND DISPLAY DEVICE

CROSS REFERENCE TO THE RELATED APPLICATION

This is a National Phase Application filed under 35 U.S.C. 371 as a national stage of PCT/CN2018/119365, filed Dec. 5, 2018, an application claiming the benefit of Chinese Patent Application No. 201810360461.8 entitled "Perovskite film and method for manufacturing the same, perovskite electroluminescent device and method for manufacturing the same, and display device" filed on Apr. 20, 2018, the entire contents of each of which is incorporated herein by reference.

TECHNICAL FIELD

The present disclosure belongs to the technical field of displaying, and particularly relates to a perovskite film and a method for manufacturing the same, a perovskite electroluminescent device and a method for manufacturing the same, and a display device.

BACKGROUND

Recently, organic-inorganic hybrid perovskite has become a research hotspot due to their excellent photoelectric properties, especially in the field of solar energy. Novel perovskite luminescent materials have the advantages of simple manufacturing process, adjustable luminescence spectrum, high color purity and low cost. However, the brightness, efficiency and stability of perovskite light-emitting diodes (PeLEDs) are not desirable, which is much inferior to the conventional inorganic CdSe quantum dot electroluminescent devices.

Therefore, it is necessary to further optimize the manufacturing process of the perovskite film.

SUMMARY

The present disclosure is directed to providing a perovskite film with improved luminous efficiency and a method for manufacturing the same, a perovskite electroluminescent device and a method for manufacturing the same, and a display device comprising the perovskite electroluminescent device.

In one aspect, the present disclosure provides a perovskite film comprising crystalline perovskite and a halogenated amine ligand grafted onto the crystalline perovskite.

Optionally, the crystalline perovskite is any one selected from a group consisting of a perovskite nanocrystal, a perovskite quantum dot and a combination thereof.

The perovskite nanocrystal has a particle size of 21 nm to 200 nm. The perovskite quantum dot has a particle size of 3 nm to 20 nm.

Optionally, the perovskite is any perovskite having a molecular structure of $ABX_3$, wherein A is any one selected from a group consisting of an organic ammonium group, formamidine, cesium ion and combinations thereof; B is any one selected from a group consisting of lead ion, tin ion and combinations thereof; and X is any one selected from a group consisting of chlorine, bromine, iodine and combinations thereof.

Optionally, the halogenated amine ligand is a brominated amine ligand.

The brominated amine ligand is any one material selected from a group consisting of 3,3-diphenylpropylamine bromide, ethylamine bromide, butylamine bromide, octylamine bromide, phenylethylamine bromide, phenylpropylamine bromide and combinations thereof.

In another aspect, the present disclosure provides a method for manufacturing the above perovskite film, comprising:

adding a material comprising the halogenated amine ligand to a precursor solution of the perovskite;

applying the precursor solution added with the material comprising the halogenated amine ligand onto a substrate; and adding an anti-solvent to the precursor solution on the substrate to make the perovskite crystallize and the halogenated amine ligand graft onto the crystalline perovskite, so as to form the perovskite film.

Optionally, the step of applying the precursor solution added with the material comprising the halogenated amine ligand onto a substrate comprises:

applying the precursor solution added with the material comprising the halogenated amine ligand onto the substrate by spin coating.

The crystalline perovskite is selected from a group consisting of a perovskite nanocrystal, a perovskite quantum dot and a combination thereof.

Optionally, the anti-solvent is any one selected from a group consisting of toluene, chloroform, chlorobenzene, acetone and combinations thereof.

It is further preferred that the precursor solution comprises a solvent selected from a group consisting of DMF, DMSO and a combination thereof.

The present disclosure further provides another method for manufacturing the above perovskite film, comprising:

mixing the crystalline perovskite grafted with the halogenated amine ligand and an organic solvent to form a perovskite colloidal solution;

applying the perovskite colloidal solution onto a substrate; and removing the organic solvent to form the perovskite film.

Optionally, the step of applying the perovskite colloid solution onto a substrate comprises:

applying the perovskite colloid solution onto a substrate by spin coating.

Optionally, the organic solvent is any one selected from a group consisting of n-hexane, tetrahydrofuran, chlorobenzene, chloroform and combinations thereof.

In still another aspect, the present disclosure provides an electroluminescent device comprising an anode, a cathode, and a light-emitting layer between the cathode and the anode, wherein the light-emitting layer comprises the above perovskite film.

In yet another aspect, the present disclosure provides a method for manufacturing the above electroluminescent device, comprising steps of the above method for manufacturing the perovskite film.

In still yet another aspect, the present disclosure provides a display device comprising the above electroluminescent device.

REFERENCES 10, substrate; 1, anode; 2, cathode; 3, light-emitting layer;
4, hole-injection layer; 5, hole-transport layer;
6, electron-injection layer; 7, electron-transport layer

DETAILED DESCRIPTION OF THE EMBODIMENTS

For a better understanding of the embodiments of the present disclosure, the present disclosure will be further described in detail below with reference to the accompanying drawings and specific embodiments.

Some embodiments of the present disclosure provide a perovskite film comprising crystalline perovskite and a halogenated amine ligand grafted onto the crystalline perovskite.

The crystalline perovskite is any one selected from a group consisting of a perovskite nanocrystal, a perovskite quantum dot and a combination thereof.

The perovskite nanocrystal has a particle size of 21 nm to 200 nm. The perovskite quantum dot has a particle size of 3 nm to 20 nm. The particle size of the perovskite nanocrystal and the perovskite quantum dot may be specifically selected according to process requirements.

Figure 10:
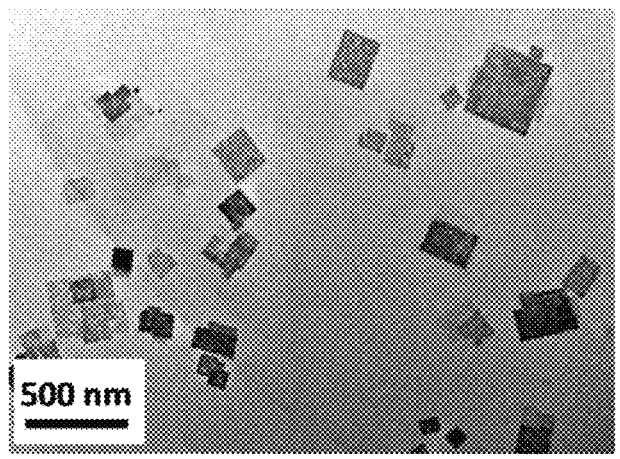
FIG. 10 is a transmission electron microscope (TEM) photograph of a perovskite nanocrystal according to an embodiment of the present disclosure.
Figure 11:
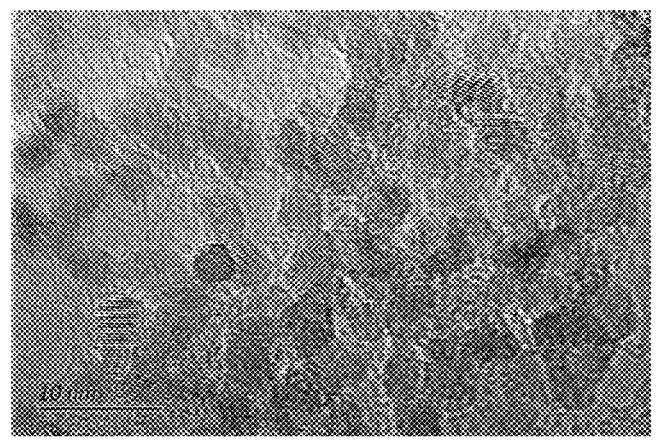
FIG. 11 is a TEM photograph of a perovskite quantum dot according to an embodiment of the present disclosure.

Preferably, in some embodiments of the present disclosure, the perovskite film comprises the perovskite nanocrystal and the perovskite quantum dot, as shown in FIGS. 10 and 11 respectively. In other words, the perovskite film is a composite film.

Optionally, the perovskite is any perovskite having a molecular structure of $ABX_3$; wherein A is any one selected from a group consisting of an organic ammonium group, formamidine, cesium ion and combinations thereof; B is any one selected from the group consisting of lead ion, tin ion and a combination thereof; and X is any one selected from a group consisting of chlorine, bromine, iodine and combinations thereof.

Optionally, the halogenated amine ligand is a brominated amine ligand.

The brominated amine ligand is any material selected from a group consisting of 3,3-diphenylpropylamine bromide, ethylamine bromide, butylamine bromide, octylamine bromide, phenylethylamine bromide, phenylpropylamine bromide and combinations thereof.

In the perovskite film of the present embodiment, since the halogenated amine ligand is grafted onto the crystalline perovskite, the surface of the perovskite film is smooth and the surface coverage of the crystalline perovskite is high without significant void defects. Meanwhile, since the perovskite film of the present embodiment comprises the halogenated amine ligand, the perovskite film has a high fluorescence quantum yield (>70%). In addition, since the halogenated amine ligand generally results a good hydrophobic property, the perovskite film has good stability in air.

In particular, the composite perovskite film of the present embodiment combines the superior carrier transport ability of the perovskite nanocrystals with the superior luminous efficiency of the perovskite quantum dot, and thus the performance of the composite perovskite film can be optimized by adjusting the ratio of the perovskite nanocrystal and the perovskite quantum dot.

Further embodiments of the present disclosure provide a method for manufacturing the above perovskite film, comprising the following steps.

Step a), adding a material comprising a halogenated amine ligand to a precursor solution of the perovskite.

having a molecular structure of $ABX_3$, and the precursor solution of the perovskite comprises AX, $BX_2$ and a solvent; wherein A is any one selected from the group consisting of organic ammonium groups (such as methylammonium, ethylammonium, propylammonium and the like), formamidine ($NH_2CH=NH^{2+}$, FA), cesium ion and combinations thereof; B is any one selected from the group consisting of lead ion, tin ion and a combination thereof; X is any one selected from a group consisting of chlorine, bromine, iodine and combinations thereof; and the solvent is any aprotic solvents with higher polarity, such as dimethylformamide (DMF), dimethyl sulfoxide (DMSO) and the like.

The A, B and X may not be limited to the above cases, and they may be selected depending on specific circumstances.

The halogenated amine ligand in step a) is preferably a brominated amine ligand, although a chlorinated amine ligand or an iodinated amine ligand may also be used.

Figure 1:
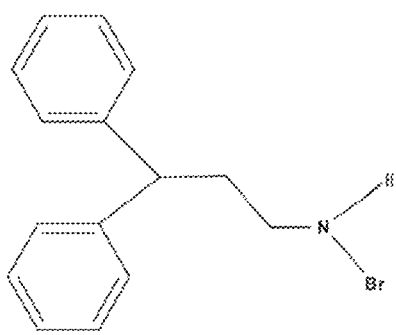
FIG. 1 is a molecular formula of a material comprising a brominated amine ligand according to an embodiment of the present disclosure.

Specifically, the material comprising a brominated amine ligand may be any one selected from a group consisting of 3,3-diphenylpropylamine bromide, ethylamine bromide, butylamine bromide, octylamine configured bromide, phenylethylamine bromide, phenylpropylamine bromide and combinations thereof. The material comprising a brominated amine ligand is preferably 3,3-diphenylpropylamine bromide (DPPA-Br) having a the formula shown in FIG. 1.

Step b), applying the precursor solution added with the material comprising a halogenated amine ligand onto a substrate.

Prior to performing this step, the substrate is preferably cleaned in advance. For example, the substrate is wiped sequentially with deionized water, acetone solution, ethanol solution and isopropanol solution, and ultrasonically washed. Then the substrate is blown dry by using nitrogen gas. The cleaned substrate is subjected to oxygen plasma pretreatment to enhance the wettability of the substrate surface.

The substrate in the embodiments of the present disclosure may be a glass substrate, a flexible ITO substrate, a silver nanowire substrate or other transparent electrode substrates.

In step b), the precursor solution added with the material comprising a halogenated amine ligand may be applied onto the substrate by spin coating.

Step c), adding 200 to 1,000 µL of an anti-solvent to the precursor solution applied on the substrate to make the perovskite crystallize and the halogenated amine ligand material graft onto the crystalline perovskite, so as to form the perovskite film.

The anti-solvent may be added within 3 to 7 seconds since the homogenizer starts, which will result a high quality film. The timing of adding the anti-solvent and the amount of the anti-solvent can be determined by those skilled in the art according to the temperature and the materials used.

The anti-solvent added in the step c) may be any solvent selected from the group consisting of toluene, chloroform, chlorobenzene, acetone and combinations thereof. The anti-solvent is not limited to the above solvents and may be selected depending on the precursor solution of the perovskite.

It should be noted that, in the method for manufacturing a perovskite film according to the embodiments of the present disclosure, the size of the crystalline perovskite may be controlled by adjusting the added amounts of the material comprising a halogenated ligand and the anti-solvent.

The crystalline perovskite with a particle size above 21 nm is commonly referred to as a perovskite nanocrystal, while the crystalline perovskite with a particle size below 20 nm is commonly referred to as a perovskite quantum dot. Generally, when the amount of the material comprising a halogenated ligand is large, it is liable to form a perovskite quantum dot which has a superior luminous efficiency; and when the amount of the material comprising a halogenated ligand is small, it is liable to form a perovskite nanocrystal which has a superior carrier transport capacity. For example, the perovskite quantum dot could be obtained by adjusting the ratio of the ligand to the perovskite precursor to 2:10 or less.

Other embodiments of the present disclosure further provide another method for manufacturing a perovskite film, comprising the following steps.

Step a): mixing the pre-made perovskite grafted with the halogenated amine ligand and an organic solvent to form a perovskite colloidal solution.

The organic solvent is any solvent selected from a group consisting of n-hexane, tetrahydrofuran, chlorobenzene, chloroform and combinations thereof.

The perovskite is a perovskite having a molecular structure of $ABX_3$; wherein A is any one selected from a group consisting of organic ammonium groups (such as methylammonium, ethylammonium, propylammonium and the like), formamidine, cesium ion and combinations thereof; B is any one selected from a group consisting of lead ion, tin ion and a combination thereof; and X is any one selected from a group consisting of chlorine, bromine, iodine and combinations thereof. Said A, B and X are not limited to the above and may be selected according to specific situations.

The perovskite may be a perovskite nanocrystal, a perovskite quantum dot or a mixture thereof. When the perovskite comprises both of the perovskite nanocrystal and the perovskite quantum dot, a composite perovskite film could be formed.

The halogenated amine ligand is preferably a brominated amine ligand, although a chlorinated amine ligand or an iodinated amine ligand may also be used.

The material comprising a brominated amine ligand may be any one selected form a group consisting of 3,3-diphenylpropylamine bromide, ethylamine bromide, butylamine bromide, octylamine configured bromide, phenylethylamine bromide, phenylpropylamine bromide and combinations thereof.

Step b): applying the colloidal solution obtained in the step a) onto a substrate to form the perovskite film.

Prior to performing this step, the substrate is cleaned preferably in advance. Specifically, the substrate is wiped sequentially with deionized water, acetone solution, ethanol solution and isopropanol solution, and ultrasonically washed. Then the substrate is blown dry by using nitrogen gas. The cleaned substrate is subjected to oxygen plasma pretreatment to enhance the wettability of the substrate surface.

Specifically, the colloidal solution obtained in the step a) may be dropped onto the substrate by using a nylon filter head, and then spin-coated at a high speed of 2,500 rpm to form a composite perovskite film.

Figure 15:
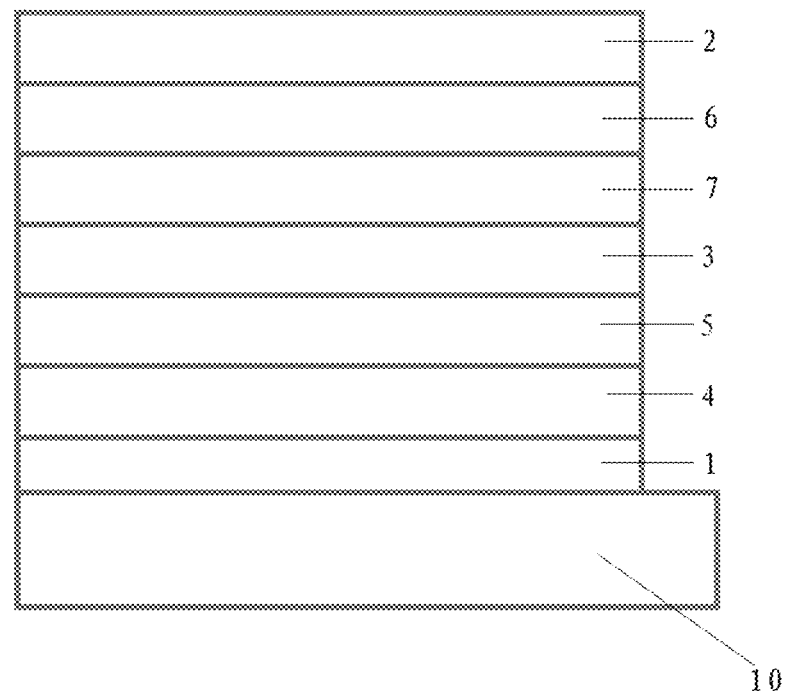
FIG. 15 is a schematic structural diagram of an electroluminescent device according to an embodiment of the present disclosure.

As shown in FIG. 15, other embodiments of the present disclosure provide an electroluminescent device comprising a cathode 2, an anode 1 and a light-emitting layer 3 between the cathode 2 and the anode 1, which are disposed on a substrate 10; wherein the light-emitting layer 3 comprises the perovskite film according to the present disclosure.

Since the light-emitting layer 3 of the electroluminescent device comprises the perovskite film according to the present disclosure, the luminance and current efficiency of the electroluminescent device are effectively improved.

Especially, when the perovskite film comprises both of the perovskite nanocrystal and the perovskite quantum dot (that is, the perovskite film is a composite film), the electroluminescent device can improve the performance of the electroluminescent device effectively by virtue of the higher carrier transport speed, the longer diffusion length and the ultra-high fluorescence quantum yield of the composite perovskite film.

The electroluminescent device may further comprise other essential components of conventional electroluminescent devices, such as a hole-injection layer 4, a hole-transport layer 5, an electron-injection layer 6, an electron-transport layer 7 and the like.

Yet other embodiments of the present disclosure provide a display device comprising the electroluminescent device according to the present disclosure.

The display device may be an OLED display device, such as an electronic paper, an OLED panel, a mobile phone, a tablet computer, a television, a display, a notebook computer, a digital photo frame, a navigator, and the like, or any product or component with displaying function.

Since the display device comprises the electroluminescent device according to the present disclosure, the displaying effect is better.

EXAMPLES

Example 1

Preparation of 3,3-diphenylpropylamine bromide (DPPA-Br)

28.9 g of 3,3-diphenylpropylamine (DPPA) was mixed with 30 mL of ethanol, and the obtained mixture was cooled to 10° C. or less with an ice water bath. Then 17 mL of HBr aqueous solution was added dropwise and the reaction was carried out for two hours. After drying by rotary evaporation, 30 ml of ethanol was used for recrystallization, followed by suction filtration and washing with anhydrous diethyl ether for 3 times. Finally 30 g of DPPA-Br is obtained as a product after drying in vacuum at 50° C. for 12 hours.

Example 2

Green Light Perovskite Film and Method for Manufacturing the Same 50 mg of FABr (formamidine hydrobromide), 146.8 mg of $PbBr_2$ (lead bromide), and 46.7 mg of DPPA-Br (3,3-diphenylpropylamine bromide) were dissolved in 2 mL of anhydrous DMF (dimethylformamide) to formulate a precursor solution. After stirring at 60° C. for 2 hours, 80 µL of the precursor solution was added dropwise onto the glass substrate by a 0.22 µm nylon filter head. During the spin coating with a rotation speed of 4,000 rpm, 250 µL of toluene was added dropwise as an anti-solvent. After annealing at 70° C., a green light polycrystalline perovskite film with high luminous efficiency was obtained.

Figure 2:
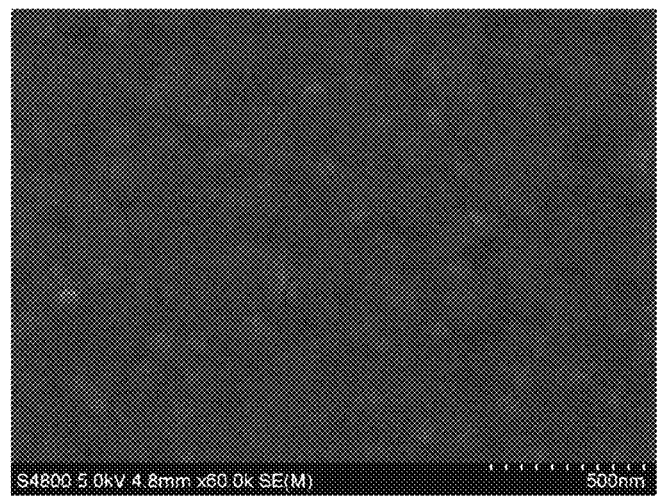
FIG. 2 is a scanning electron microscope (SEM) photograph of a surface of a green light perovskite film according to an embodiment of the present disclosure.
Figure 3:
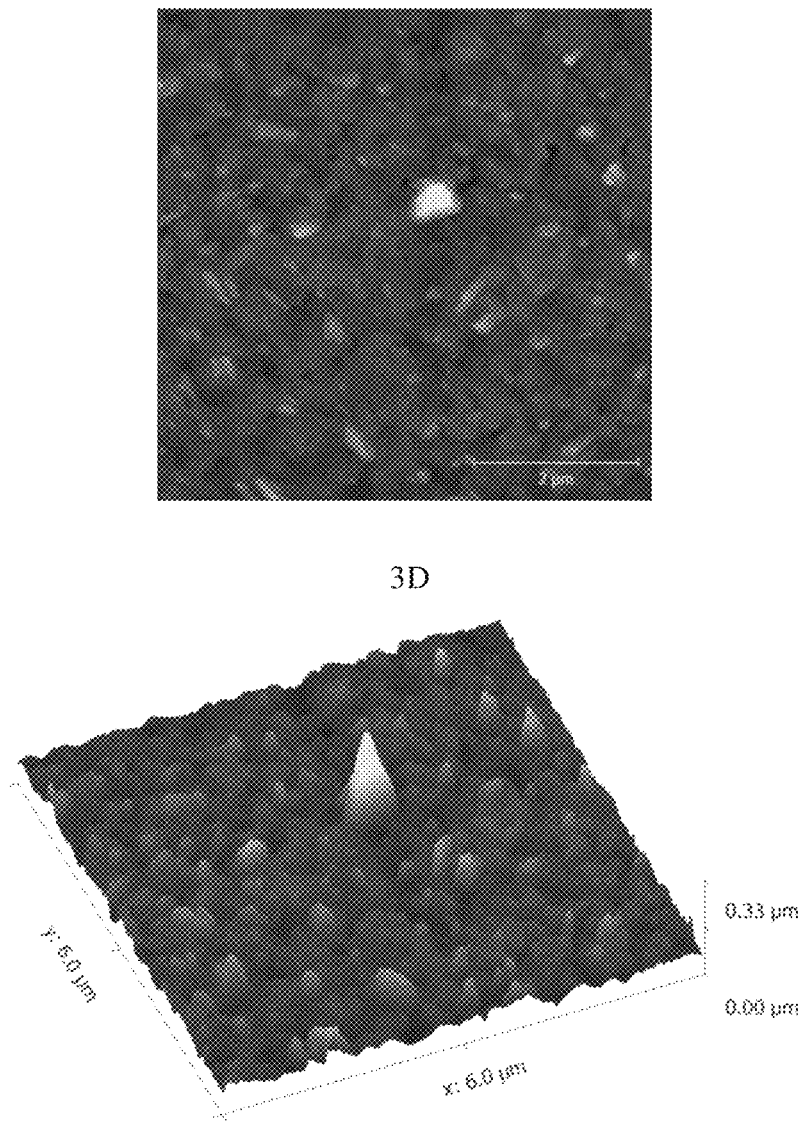
FIG. 3 is an atomic force microscope (AFM) photograph of a surface of a green light perovskite film according to an embodiment of the present disclosure.

The SEM (scanning electron microscope) image shown in FIG. 2 and the AFM (atomic force microscope) image shown in FIG. 3 of the surface of the green light perovskite film indicated that, the obtained green light polycrystalline perovskite film is very dense without significant defects and has a uniform and flat surface with an average surface roughness of only 10 nm. The green light perovskite film has a very high fluorescence quantum yield (about 78%).

Figure 4:
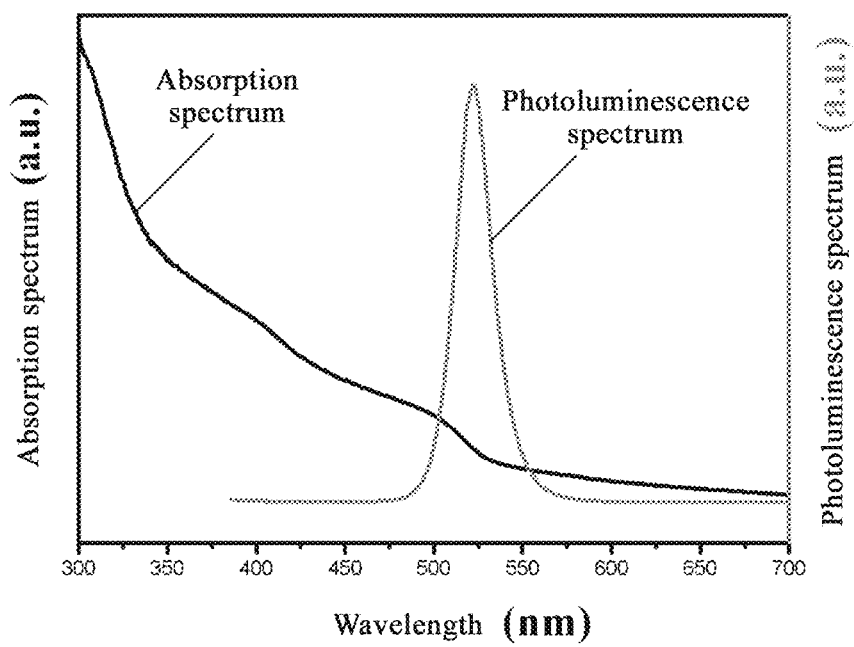
FIG. 4 is a schematic diagram of an absorption spectrum and a photoluminescence spectrum of a green light perovskite film according to an embodiment of the present disclosure.
Figure 5:
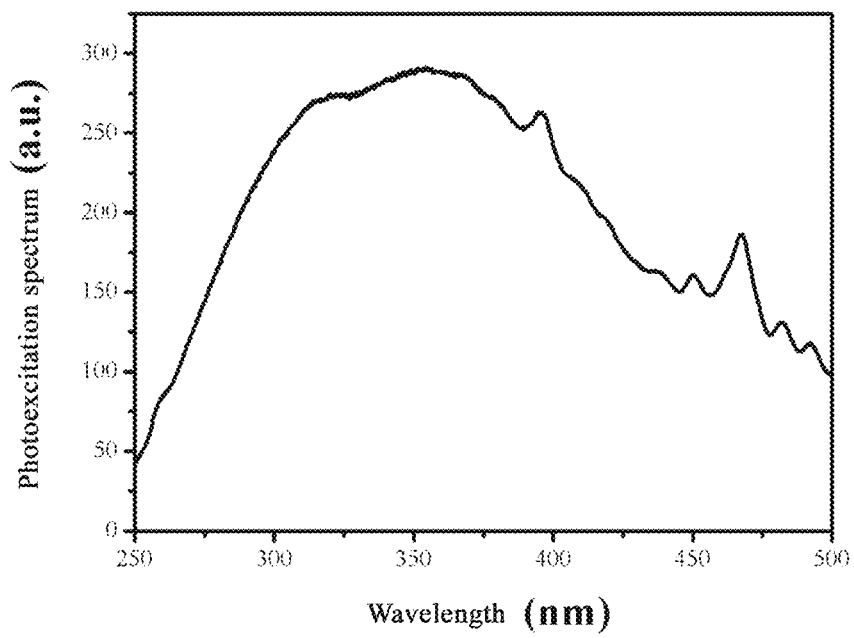
FIG. 5 is a schematic diagram of a photoexcitation spectrum of a green light perovskite film according to an embodiment of the present disclosure.

It can be seen from FIG. 4 that the emission peak of the green light perovskite film is at 522 nm and the peak width at half height is only 22 nm. The emission spectrum and absorption spectrum of the green light perovskite film is similar to those of the green light organic-inorganic hybrid quantum dot. It can be speculated that the green light perovskite film contains a large amount of perovskite quantum dot, and the electroluminescent device manufactured by using this green light perovskite film can effectively enhance the color gamut of the display device, as shown in FIG. 5.

Example 3

Red Light Perovskite Film and Method for Manufacturing the Same 68.8 mg of FAI (formamidine hydroiodide), 184.4 mg of $PbI_2$ (lead iodide), and 46.7 mg of DPPA-Br (3,3-diphenylpropylamine bromide) were dissolved in 2 mL of anhydrous DMF to formulate a precursor solution. After stirring at 60° C. for 2 hours, 80 µL of the precursor solution was added dropwise onto the glass substrate by a 0.22 µm nylon filter head. During the spin coating with a rotation speed of 4,000 rpm, 250 µL of toluene was added dropwise as an anti-solvent. After annealing at 70° C., a red polycrystalline perovskite film with high luminous efficiency was obtained.

Figure 6:
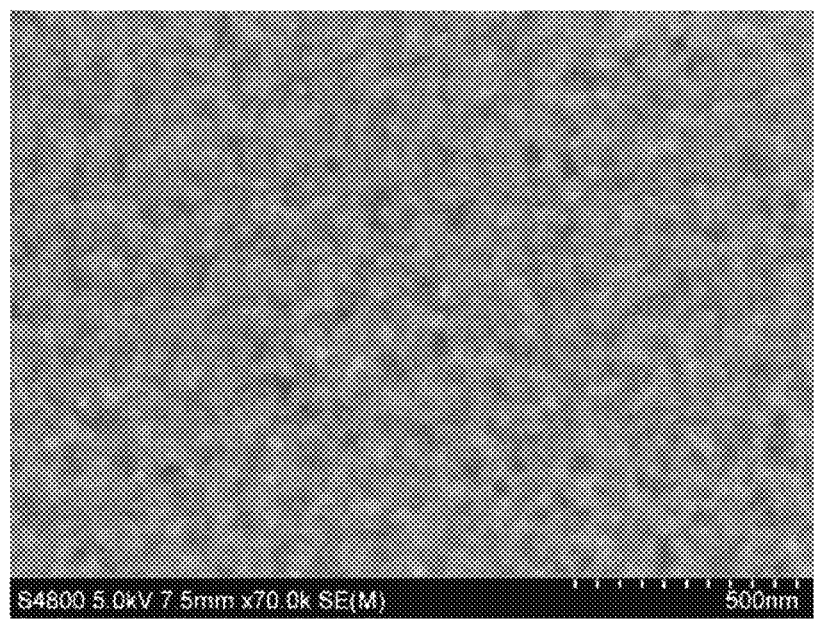
FIG. 6 is a SEM photograph of a surface of a red light perovskite film according to an embodiment of the present disclosure.
Figure 7:
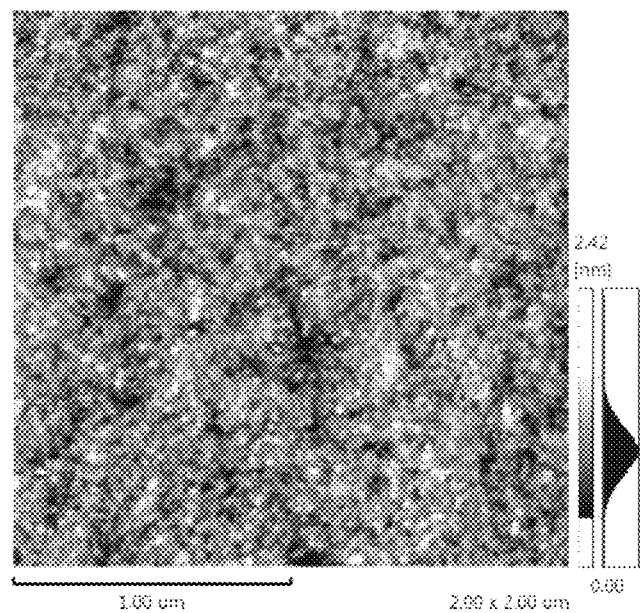
FIG. 7 is a AFM photograph of a surface of a red light perovskite film according to an embodiment of the present disclosure.
Figure 7:
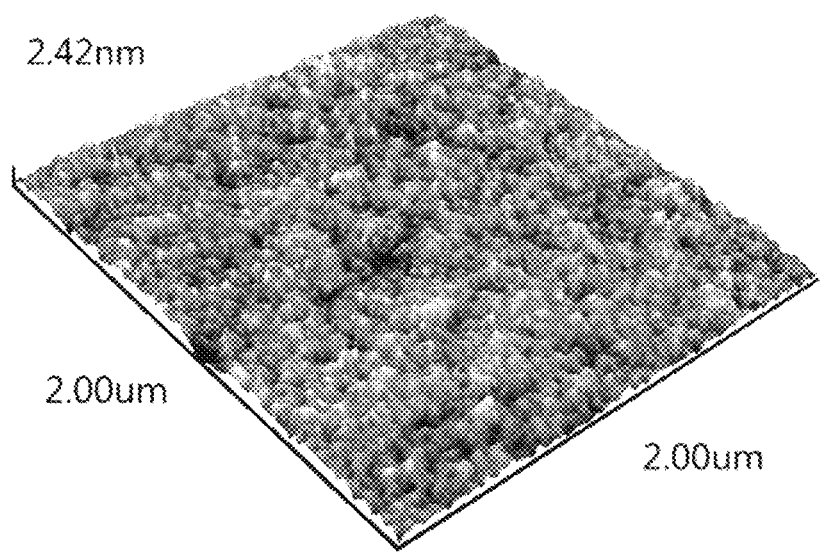

The SEM (scanning electron microscope) image shown in FIG. 6 and the AFM (atomic force microscope) image shown in FIG. 7 of the surface of the red light perovskite film indicated that, the obtained red light polycrystalline perovskite film is very dense without significant defects and has a uniform and flat surface with an average surface roughness of only 2.42 nm. The red light perovskite film has a very high fluorescence quantum yield (about 73%).

Figure 8:
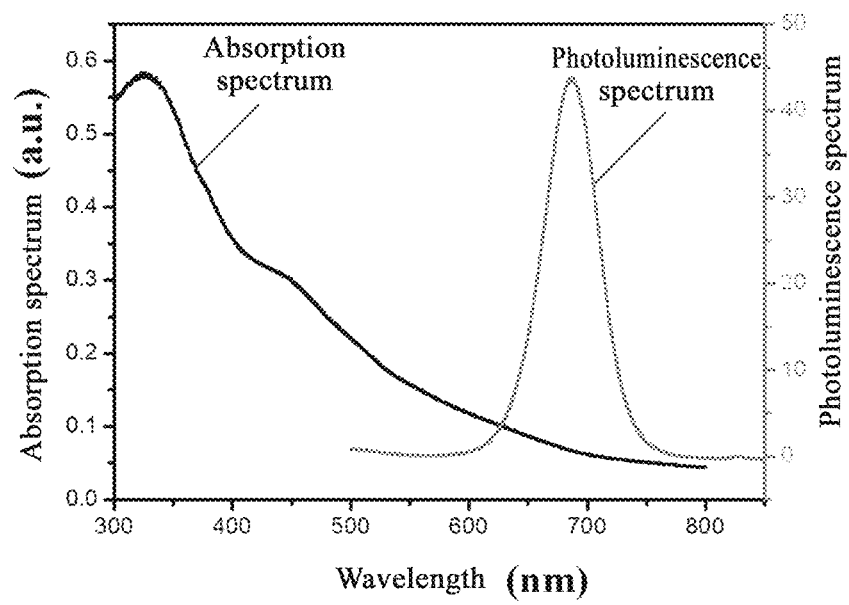
FIG. 8 is a schematic diagram of an absorption spectrum and a photoluminescence spectrum of a red light perovskite film according to an embodiment of the present disclosure.
Figure 9:
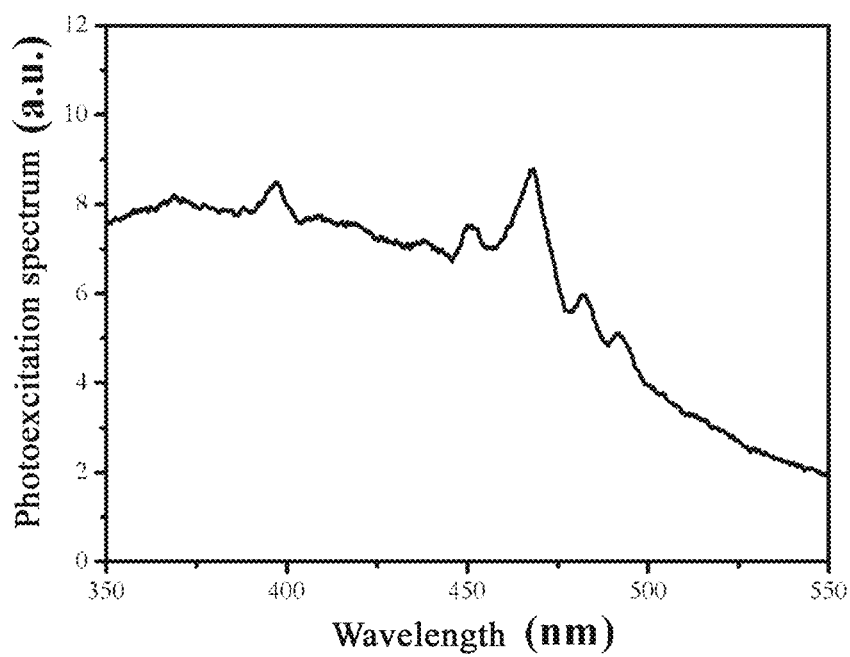
FIG. 9 is a schematic diagram of a photoexcitation spectrum of a red light perovskite film according to an embodiment of the present disclosure.

It can be seen from FIG. 8 that the emission peak of the red light perovskite film is at 687 nm and the peak width at half height is 47 nm. The emission spectrum and absorption spectrum of the red light perovskite film is similar to those of the red light organic-inorganic hybrid quantum dot. It can be speculated that the red light perovskite film contains a large amount of perovskite quantum dot, and the electroluminescent device manufactured by using the red light perovskite film can effectively enhance the color gamut of the display device, as shown in FIG. 9.

Example 4

Composite Perovskite Film and Method for Manufacturing the Same 0.16 mmol of $CH_3NH_3Br$, 0.2 mmol of $PbBr_2$, 10 µL of n-octylamine, and 0.5 mL of oleic acid were mixed, and then 5 mL of DMF was added to obtain a perovskite precursor solution. The obtained precursor solution was filtered with a 0.22 µm polytetrafluoroethylene filter head and was added dropwise to 10 mL of rapidly stirred toluene using a pipette. As the precursor solution was continuously added, the toluene solution gradually became turbid, and a yellowish green precipitate was formed. After the dropwise addition being completed, the obtained turbid solution was subjected to fractional centrifugation and purification treatment to obtain a large-sized perovskite nanocrystal and a small-sized perovskite quantum dot.

30 mg of the grafted composite perovskite was then mixed with 6 mL of n-hexane to form a perovskite colloidal solution.

The obtained colloidal solution was dropped onto a glass substrate through a 0.22 µm nylon filter head, and then was spin coated with a high speed of 2,500 rpm to form a composite perovskite film.

Example 5

Green Light Composite Perovskite Film and Method for Manufacturing the Same 50 mg of FABr (formamidine hydrobromide), 146.8 mg of $PbBr_2$ (lead bromide), and 23 mg of DPPA-Br (3,3-diphenylpropylamine bromide) were dissolved in 2 mL of anhydrous DMF (dimethylformamide) to formulate a precursor solution. After stirring at 60° C. for 2 hours, 80 µL of the precursor solution was added dropwise onto the glass substrate by a 0.22 µm nylon filter head. During the spin coating with a rotation speed of 4,000 rpm, 250 µL of toluene was added dropwise as an anti-solvent. The dropping time was delayed by about 1 second compared with the above non-composite film to control the formation of perovskite crystal grains in the film, thereby rapidly forming a green light composite perovskite film.

Figure 12:
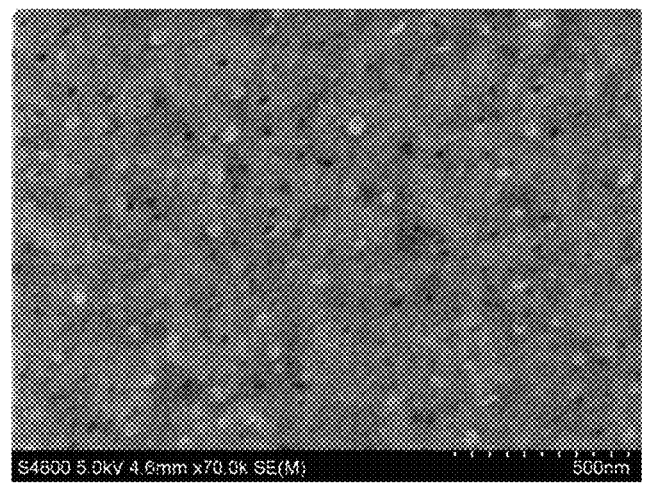
FIG. 12 is a SEM photograph of a surface of a green light perovskite film according to an embodiment of the present disclosure.
Figure 13:
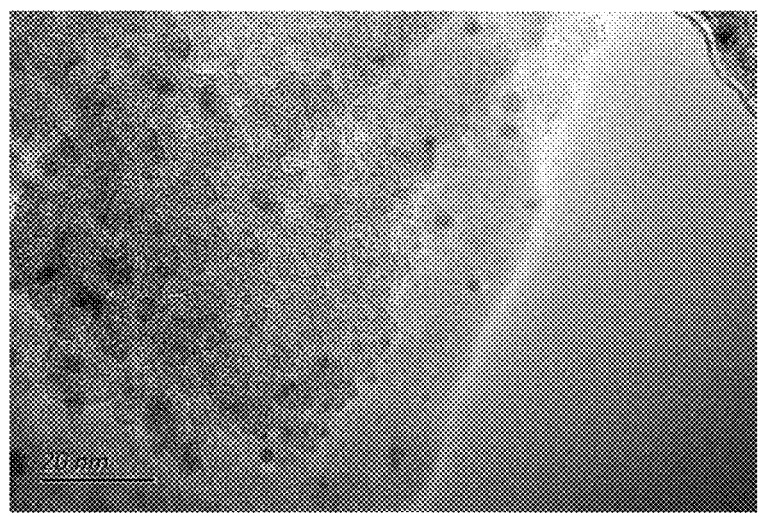
FIG. 13 is a TEM photograph of a perovskite nanocrystal in a green light perovskite film according to an embodiment of the present disclosure.
Figure 14:
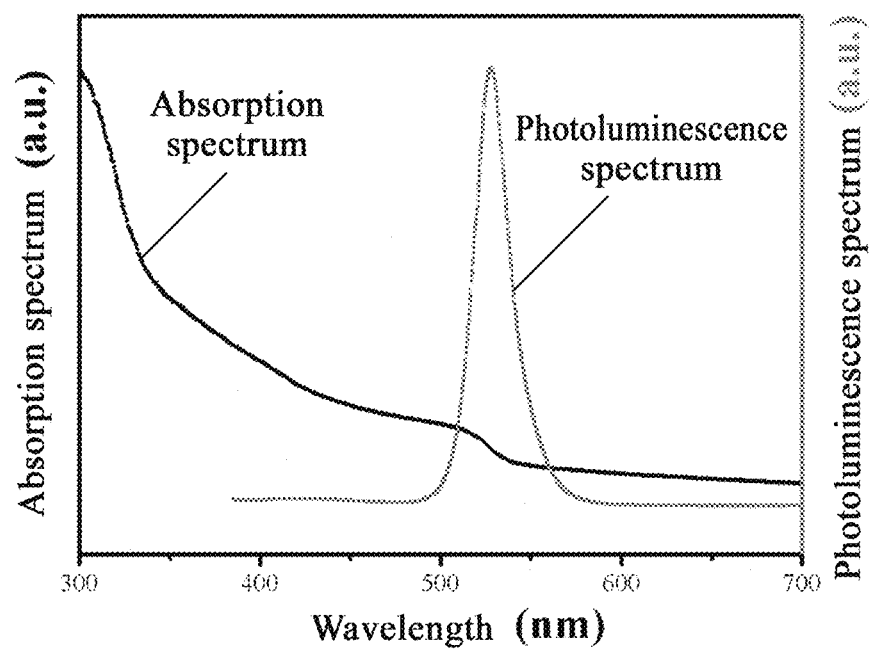
FIG. 14 is a schematic diagram of an absorption spectrum and a photoluminescence spectrum of a green light perovskite film according to an embodiment of the present disclosure.

From the SEM (scanning electron microscope) image shown in FIG. 12, it can be seen that the surface morphology of the green light composite perovskite film is very flat and uniform. From the TEM (transmission electron microscope) image shown in FIG. 13, it can be seen that the green light composite perovskite film is composed of two different sized perovskite. The emission spectrum and the absorption spectrum of the green light composite perovskite film are shown in FIG. 14, and it can be seen that the emission peak is at 526 nm and the peak width at half height is only 22 nm, which indicate that the green light composite perovskite film is an ideal material for manufacturing displays with high color gamut.

Example 6

Electroluminescent Device Comprising Green Light Perovskite and Method for Manufacturing the Same Step 1, wiping the substrate 10 sequentially using deionized water, acetone solution, ethanol solution, and isopropanol solution, and isopropanol solution and ultrasonically washing the substrate 10, and then blown drying the substrate using nitrogen gas; pretreating the cleaned substrate 10 with oxygen plasma to clean the surface and enhance the wettability of the surface.

Step 2, forming a pattern including the anode 1 by patterning.

The anode 1 serves as a connecting layer for applying a forward voltage to the electroluminescent device, and has a good electrical conductivity, visible light transparency and a high work function value. The anode 1 is usually made of an inorganic metal oxide (such as indium tin oxide ITO, zinc oxide ZnO and the like), an organic conductive polymer (such as poly 3,4-ethylenedioxythiophene/polystyrene sulfonate (PEDOT:PSS), polyaniline (PANI)) or other metal materials having a high work function value (such as gold, copper, silver, platinum and the like).

Step 3, forming the hole-injection layer 4 and the hole-transport layer 5 sequentially on the obtained substrate 10.

Specifically, in this step, poly 3,4-ethylenedioxythiophene/polystyrene sulfonate (PEDOT:PSS) and poly[(9,9-di-n-octyldecyl-2,7-diyl)-alt-(4,4'-(N-(4-n-butyl)phenyl)-diphenylamine)] (TFB) were applied by spin coating on the obtained substrate 10 with the anode 1. The coated substrate 10 was annealed, and the surface of the TFB film was cleaned with oxygen plasma, thereby forming a hole-injection layer 4 and a hole-transport layer 5, and then the substrate 10 was transferred to a nitrogen glove box.

The hole-injection layer 4 may be made of a triphenylamine compound, or a P-type doped organic layer or a P-type doped polymer, such as tris-[4-(5-phenyl-2-thienyl)benzene] amine, 4,4',4''-tris[2-naphthyl(phenyl)amino] triphenylamine (2-TNATA), 4,4',4''-tris-(3-methylphenylanilino)triphenylamine (m-MTDATA), copper phthalocyanine (CuPc), or PEDOT:PSS.

The hole-transport layer 5 may be made of an aromatic diamine compound, a triphenylamine compound, an aromatic triamine compound, a biphenyldiamine derivative, a triarylamine polymer or a carbazole polymer, such as N,N'-diphenyl-N,N'-(1-naphthyl)-1,1'-biphenyl-4,4'-diamine (NPB), N,N'-diphenyl-N,N'-bis(3-methylphenyl)-1,1'-biphenyl-4,4'-diamine (TPD), 4,4',4''-tris(carbazole-9-yl) triphenylamine (TCTA), and polyvinylcarbazole or a monomer thereof.

Step 3, forming the green light perovskite film according to an embodiment of the present disclosure on the substrate 10 obtained in the above steps.

Step 4, transferring the substrate 10 obtained in the above steps into a vacuum chamber, and forming an electron-transport layer 7 and an electron-injection layer 6 sequentially.

The electron-transport layer 7 and the electron-injection layer 6 were formed by vapor deposition with a vapor deposition pressure of $2\times10^{-4}$ Pa and a vapor deposition rates of 3 Å/s and 0.5 Å/s respectively. The electron-transport layer 7 has a thickness of 20 nm and the electron-injection layer 6 has a thickness of 1 nm.

The electron-transport layer 7 may comprise a phenanthroline derivative, an oxazole derivative, a thiazole derivative, an imidazole derivative, a metal complex or a anthracene derivative. Specifically, the electron-transport layer 7 may comprise: 8-hydroxyquinoline aluminum (Alq3), 8-hydroxyquinoline lithium (Liq), 8-hydroxyquinoline gallium, bis[2-(2-hydroxyphenyl-1)-pyridine] beryllium, 2-(4-diphenyl)-5-(4-tert-butylphenyl)-1,3,4-oxadiazole (PBD), 1,3,5-tris(N-phenyl-2-benzimidazole-2) benzene (TPBI), BCP, Bphen and the like.

The electron-injection layer 6 was made of either LiF or $CsCO_3$.

Step 5, forming a pattern including the cathode 2 by vapor deposition on the substrate 10 obtained in the above steps with a vapor deposition pressure of $2\times10^{-4}$ Pa and a vapor deposition rate of 5 Å/s, wherein the electron-transport layer 7 has a thickness of 100 nm.

Cathode 2 has a better electrical conductivity and a lower work function value. The cathode 2 is usually made of a metal material with low work function value, such as lithium, magnesium, calcium, barium, aluminum, indium and the like, or of an alloy of the above metal material with low work function value and copper, gold or silver.

The photoelectric properties of the obtained electroluminescent device were tested.

Figure 16:
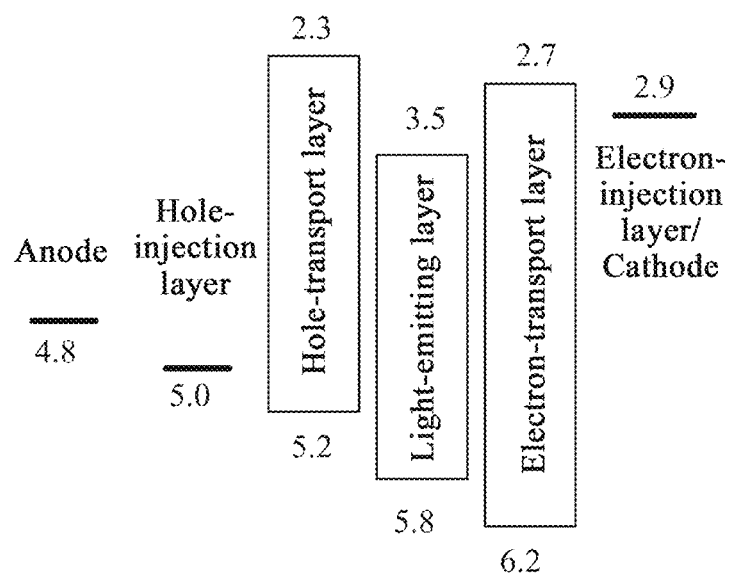
FIG. 16 is a schematic diagram of energy levels of an electroluminescent device adopting green light perovskite according to an embodiment of the present disclosure.
Figure 17:
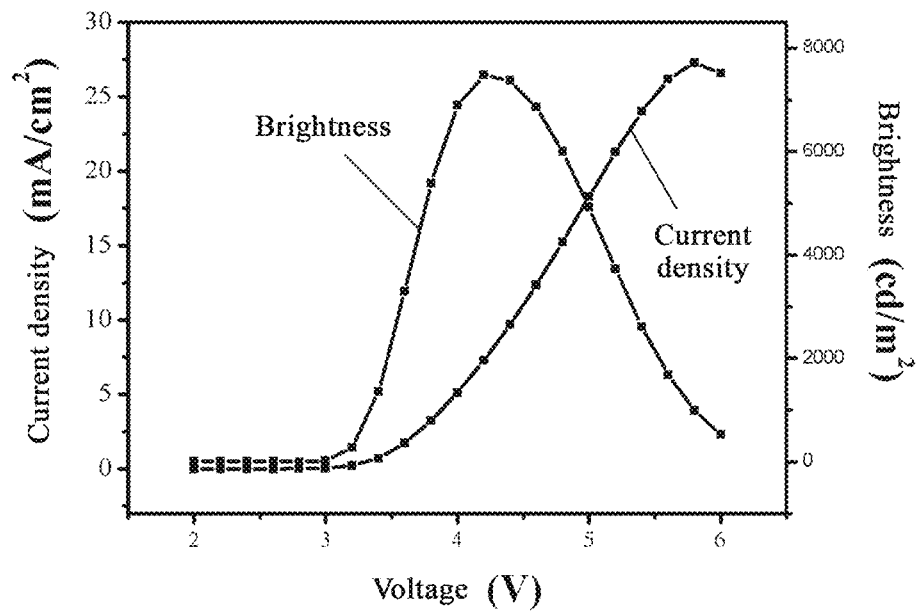
FIG. 17 is a graph showing curves of current density and luminance relative to voltage for an electroluminescent device adopting green light perovskite according to an embodiment of the present disclosure.
Figure 18:
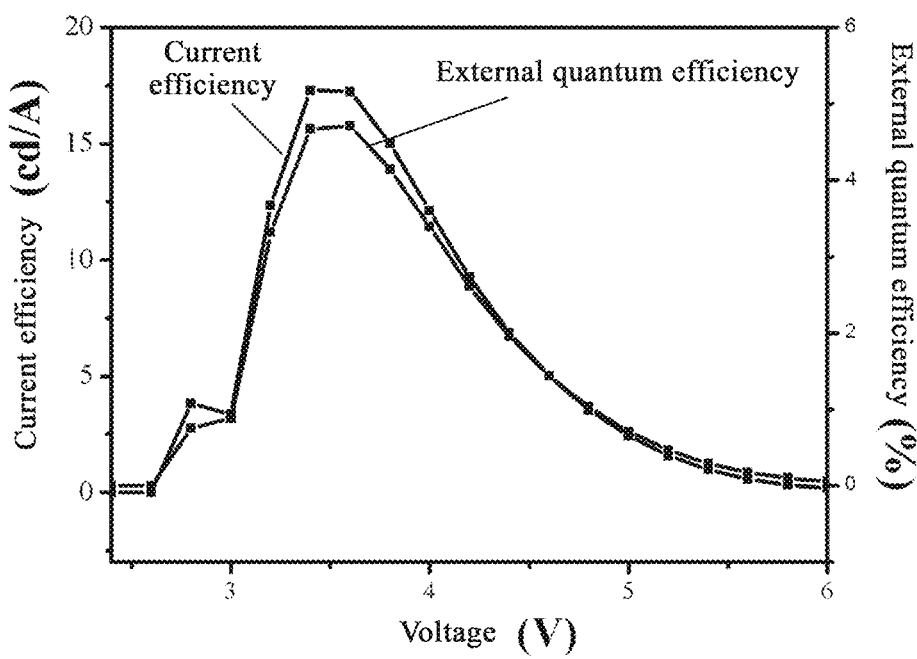
FIG. 18 is a graph showing curves of current efficiency and external quantum efficiency relative to voltage for an electroluminescent device adopting green light perovskite according to an embodiment of the present disclosure.
Figure 19:
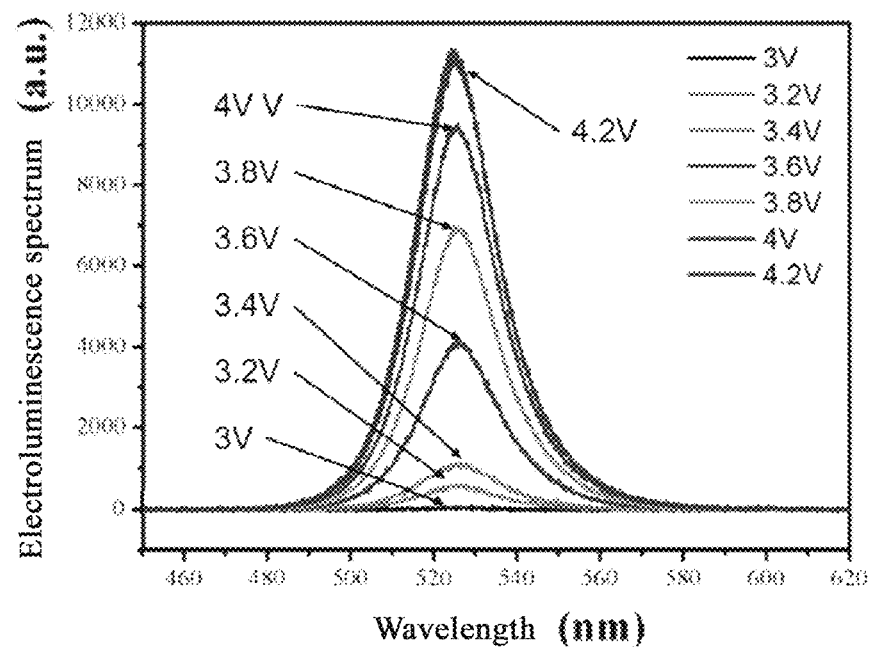
FIG. 19 is a schematic diagram of an electroluminescence spectrum of an electroluminescent device adopting green light perovskite according to an embodiment of the present disclosure.

FIG. 16 is a schematic diagram showing the relationships of the energy levels in the electroluminescent device according to the present example, which ensures that both electrons and holes can be injected into the light-emitting layer 3 at a high speed. It can be seen from the electroluminescence spectrum of FIG. 19 that, as the loading voltage of the electroluminescent device increases, the positions of the emission peaks keep consistent and a very narrow peak width at half height is maintained, which demonstrate that the electroluminescent device always maintains a balanced injection between electrons and holes during operation. As shown in FIG. 17, the green light perovskite electroluminescent device prepared using the green light perovskite film according to the embodiment of the present disclosure has a turn-on voltage of 2.8 V, and the electroluminescent device achieved a maximum brightness of 7,480 cd/m$^2$ at a relatively low voltage of 4.2 V. FIG. 18 is a graph showing the current efficiency of the electroluminescent device according to the present embodiment as a function of voltage. The electroluminescent device achieved a maximum current efficiency of more than 17 cd/A at a voltage of 3.4 V, corresponding to an external quantum efficiency of about 4.6%. It can be seen from the electroluminescence spectrum of the electroluminescent device shown in FIG. 19 that the peak of the spectrum is always maintained at 522 nm, and the peak width at half height of the spectrum is 22 nm, which has a high color purity and remains unchanged as the voltage increases.

Example 7

Electroluminescent Device Comprising Red Light Perovskite and Method for Manufacturing the Same The electroluminescent device comprising red light perovskite was prepared by the same method as the electroluminescent device comprising green light perovskite, except that the light-emitting layer 3 of the electroluminescence device comprising red light perovskite contains the red light perovskite film according to an embodiment of the present disclosure.

The photoelectric properties of the obtained electroluminescent device were tested.

Figure 20:
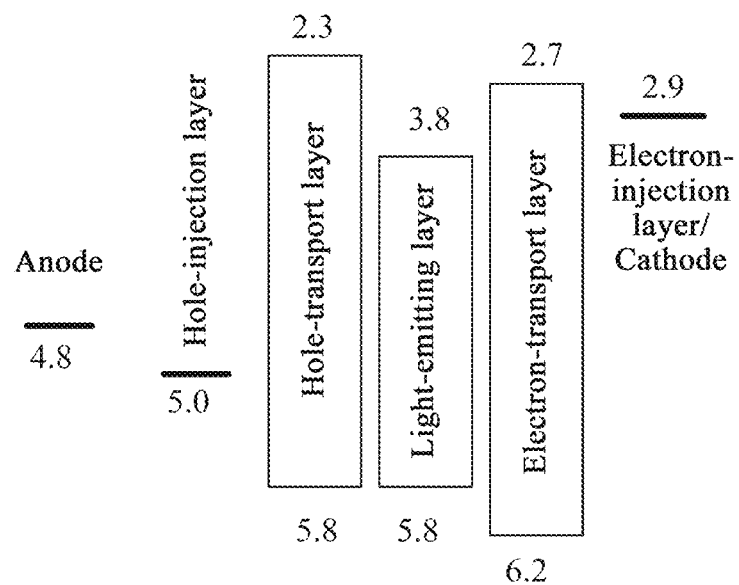
FIG. 20 is a schematic diagram of energy levels of an electroluminescent device adopting red light perovskite according to an embodiment of the present disclosure.
Figure 21:
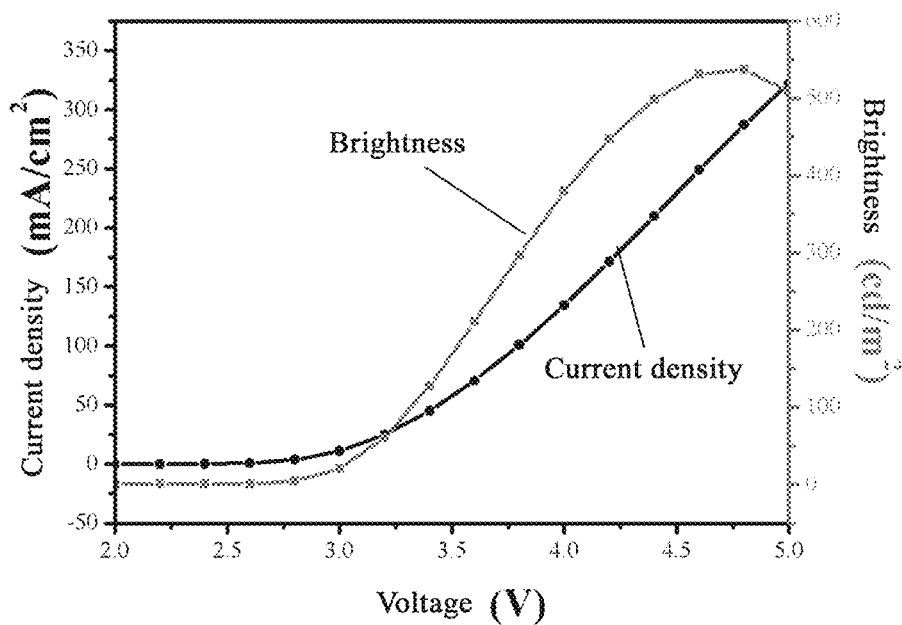
FIG. 21 is a graph showing curves of current density and luminance relative to voltage for an electroluminescent device adopting red light perovskite according to an embodiment of the present disclosure.
Figure 22:
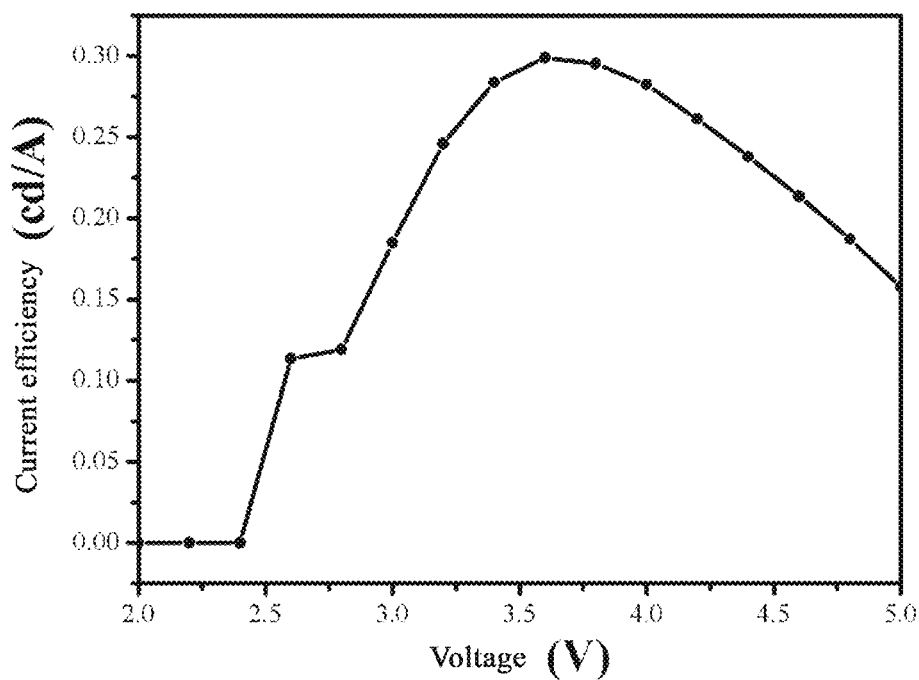
FIG. 22 is a graph showing a current efficiency-voltage curve of an electroluminescent device adopting red light perovskite according to an embodiment of the present disclosure.

FIG. 20 is a schematic diagram showing the relationships of the energy levels in the electroluminescent device in the present embodiment, which ensures that both electrons and holes can be injected into the light-emitting layer 3 at a high speed. As shown in FIG. 21, the electroluminescent device comprising the red light perovskite film according to an embodiment of the present disclosure has a turn-on voltage of 2.6 V, and the electroluminescent device achieved a maximum brightness more than 500 cd/m$^2$ at a relatively low voltage of 4.8 V. FIG. 22 is a graph showing the current efficiency of the electroluminescent device as a function of voltage. The electroluminescent device achieved a maximum current efficiency of more than 0.3 cd/A at a voltage of 3.6 V.

Example 8

Electroluminescent Device Comprising Green Light Composite Perovskite and Method for Manufacturing the Same An electroluminescent device comprising green light composite perovskite was prepared by the same method as the electroluminescent device comprising green light perovskite, except that the light-emitting layer 3 of the electroluminescent device comprising green light composite perovskite contains the green light composite perovskite film according to the present disclosure.

The photoelectric properties of the obtained electroluminescent device were tested.

Figure 23:
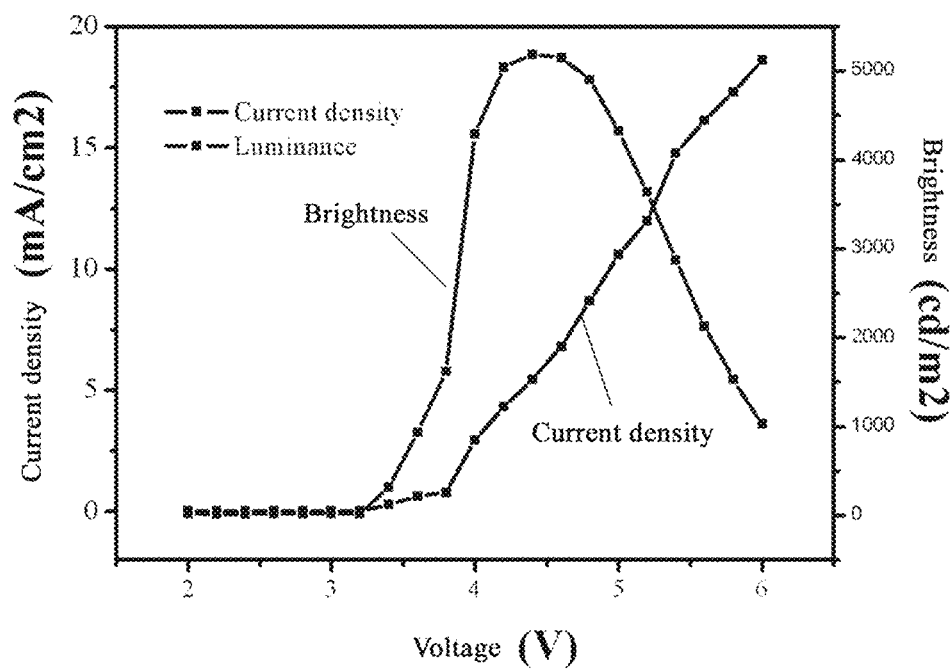
FIG. 23 is a graph showing curves of current density and luminance relative to voltage for an electroluminescent device adopting green light perovskite according to an embodiment of the present disclosure.
Figure 24:
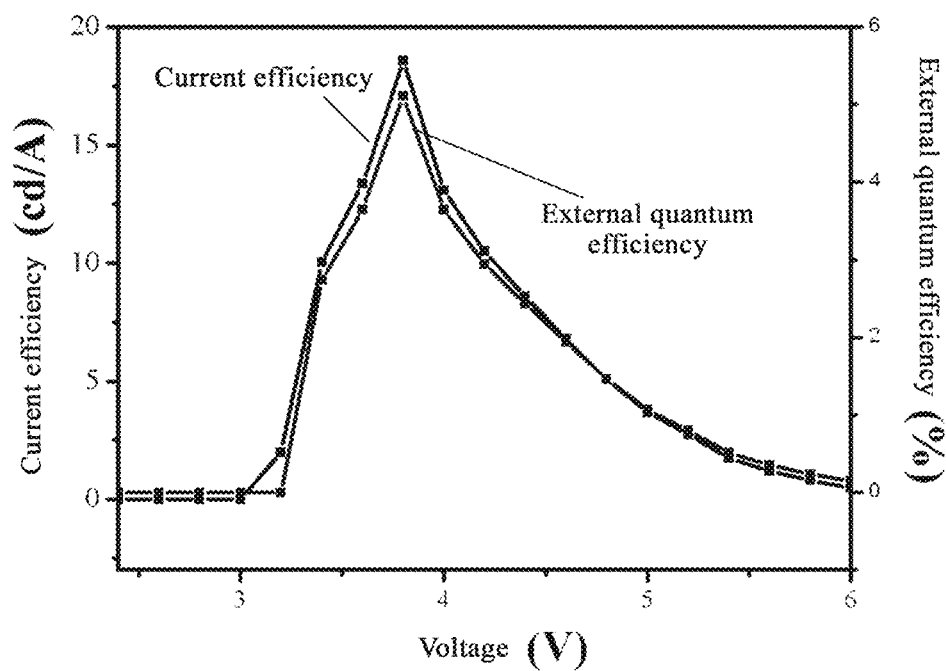
FIG. 24 is a graph showing curves of current efficiency and external quantum efficiency relative to voltage for an electroluminescent device adopting green light perovskite according to an embodiment of the present disclosure.
Figure 25:
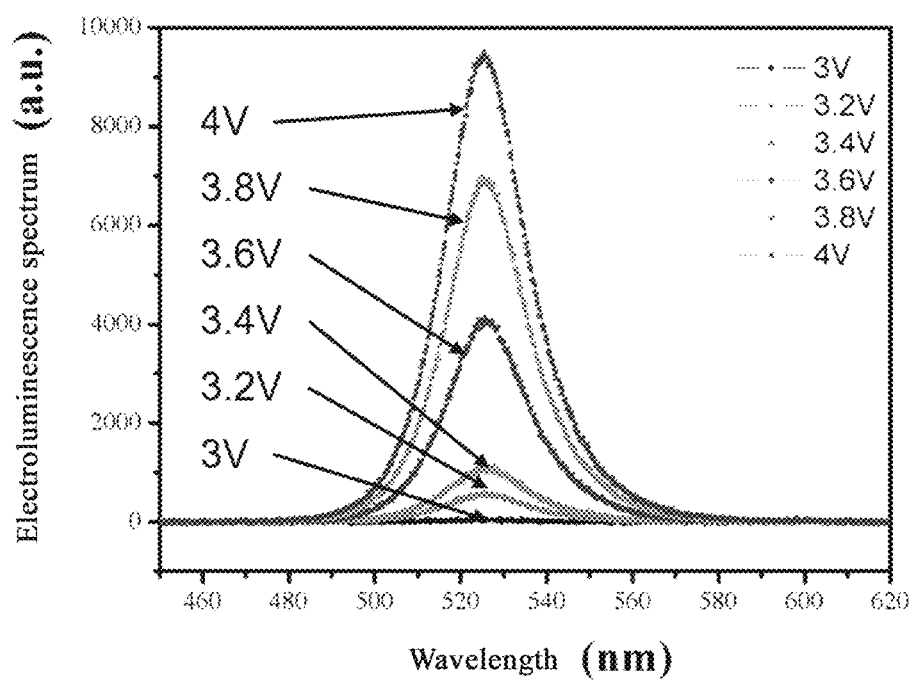
FIG. 25 is an electroluminescence spectrum of an electroluminescent device adopting green light perovskite according to an embodiment of the present disclosure.

As shown in FIG. 23, the obtained electroluminescent device has a turn-on voltage of 2.9 V, and the electroluminescent device achieved a maximum brightness more than 5,000 cd/m$^2$ at a relatively low voltage of 4 V. FIG. 24 is a graph showing the current efficiency of the electroluminescent device as a function of voltage. The electroluminescent device achieved a maximum current efficiency of more than 18 cd/A at a voltage of 3.6 V, corresponding to an external quantum efficiency of about 5.1%. It can be seen from the electroluminescence spectrum of the electroluminescent device shown in FIG. 25 that the peak of the spectrum is always maintained at 523 nm, and the peak width at half height of the spectrum is 22 nm, which has a high color purity and remains unchanged as the voltage increases.

It can be understood that the foregoing embodiments are merely illustrative embodiments employed for describing the principle of the present invention. However, the present invention is not limited thereto. For a person of ordinary skill in the art, various deformations and improvements can be made without departing from the spirit and essence of the present invention. These deformations and modifications shall fall into the protection scope of the present invention.

The invention claimed is:

1. A perovskite film, comprising a crystalline perovskite and a halogenated amine ligand grafted onto the crystalline perovskite,
    wherein the crystalline perovskite comprises a perovskite having a molecular structure of $ABX_3$, of which A is any one selected from a group consisting of an organic ammonium group, formamidine, cesium ion and combinations thereof; B is any one selected from a group consisting of lead ion, tin ion and a combination therefore; and X is any one selected from a group consisting of chlorine, bromine, iodine and combinations thereof;
    wherein the halogenated amine ligand comprises a brominated amine ligand which is any one selected from a group consisting of 3,3-diphenylpropylamine bromide, ethylamine bromide, butylamine bromide, octylamine bromide, phenylethylamine bromide, phenylpropylamine bromide and combinations thereof.

2. The perovskite film according to claim 1, wherein the crystalline perovskite is selected from a group consisting of a perovskite nanocrystal, a perovskite quantum dot and a combination thereof.

3. The perovskite film according to claim 2, wherein the perovskite nanocrystal has a particle size of 21 nm to 200 nm, and the perovskite quantum dot has a particle size of 3 nm to 20 nm.

4. A method for manufacturing the perovskite film according to claim 1, comprising:
    adding a material comprising the halogenated amine ligand to a precursor solution of the perovskite;
    applying the precursor solution added with the material comprising the halogenated amine ligand on a substrate;
    adding an anti-solvent to the precursor solution on the substrate to make the perovskite crystallize and the halogenated amine ligand graft onto the crystalline perovskite, so as to form the perovskite film.

5. The method for manufacturing the perovskite film according to claim 4, wherein the step of applying the precursor solution added with the material comprising the halogenated amine ligand on a substrate comprises:

applying the precursor solution added with the material comprising the halogenated amine ligand on a substrate by spin coating.

6. The method for manufacturing the perovskite film according to claim 4, wherein the anti-solvent is a solvent selected from a group consisting of toluene, chloroform, chlorobenzene, acetone and combinations thereof.

7. The method for manufacturing the perovskite film according to claim 4, wherein the precursor solution comprises a solvent selected from a group consisting of dimethylformamide, dimethyl sulfoxide and a combination thereof.

8. A method for manufacturing the perovskite film according to claim 1, comprising:

mixing the crystalline perovskite grafted with the halogenated amine ligand material and an organic solvent to form a perovskite colloidal solution;
applying the perovskite colloidal solution on a substrate;
removing the organic solvent to form the perovskite film.

9. The method for manufacturing the perovskite film according to claim 8, wherein the step of applying the perovskite colloidal solution on a substrate comprises:

applying the perovskite colloidal solution on a substrate by spin coating.

10. The method for manufacturing the perovskite film according to claim 8, wherein the organic solvent is a solvent selected from a group consisting of n-hexane, tetrahydrofuran, chlorobenzene, chloroform and combinations thereof.

11. An electroluminescent device, comprising an anode, a cathode, and a light-emitting layer between the cathode and the anode; wherein the light-emitting layer comprises the perovskite film according to claim 1.

12. A method for manufacturing the electroluminescent device of claim 11, comprising steps for manufacturing the perovskite film as follows:

adding a material comprising the halogenated amine ligand to a precursor solution of the perovskite;
applying the precursor solution added with the material comprising the halogenated amine ligand on a substrate;
adding an anti-solvent to the precursor solution on the substrate to make the perovskite crystallize and the halogenated amine ligand graft onto the crystalline perovskite, so as to form the perovskite film.

13. A method of manufacturing the electroluminescent device of claim 11, comprising steps for manufacturing the perovskite film as follows:

mixing the crystalline perovskite grafted with the halogenated amine ligand material and an organic solvent to form a perovskite colloidal solution;
applying the perovskite colloidal solution on a substrate;
removing the organic solvent to form the perovskite film.

14. A display device, comprising the electroluminescent device of claim 11.

* * * * *